US011442800B2

(12) United States Patent
Krishna et al.

(10) Patent No.: US 11,442,800 B2
(45) Date of Patent: Sep. 13, 2022

(54) WATCHDOG CIRCUIT SYSTEMS

(71) Applicant: Hamilton Sundstrand Corporation, Charlotte, NC (US)

(72) Inventors: Rajeeva Gopala Krishna, Bengaluru (IN); Shihab T. A. Muhammed, Ernakulam (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 210 days.

(21) Appl. No.: 16/985,362

(22) Filed: Aug. 5, 2020

(65) Prior Publication Data
US 2021/0294612 A1 Sep. 23, 2021

(30) Foreign Application Priority Data

Mar. 17, 2020 (IN) .............................. 202041011498

(51) Int. Cl.
| | |
|---|---|
| *G06F 11/07* | (2006.01) |
| *G06F 9/4401* | (2018.01) |
| *H03K 3/037* | (2006.01) |
| *H03K 21/08* | (2006.01) |

(Continued)

(52) U.S. Cl.
CPC ........ *G06F 11/0757* (2013.01); *G06F 9/4403* (2013.01); *H03K 3/037* (2013.01); *H03K 5/00* (2013.01); *H03K 5/19* (2013.01); *H03K 21/08* (2013.01); *H03K 2005/00078* (2013.01)

(58) Field of Classification Search
CPC .............................. G06F 11/0757; H03K 5/19
See application file for complete search history.

(56) References Cited

U.S. PATENT DOCUMENTS

| | | |
|---|---|---|
| 4,627,060 A | 12/1986 | Huang et al. |
| 4,796,211 A | 1/1989 | Yokouchi et al. |
| 9,612,893 B2 * | 4/2017 | David ................. G06F 11/0745 |

(Continued)

OTHER PUBLICATIONS

El-Attar A M et al: "An Improved Watchdog Timer to Enhance Imaging System Reliability In The Presence Of Soft Errors", Signal Processing and Information Technology, 2007 IEEE International Symposium on, IEEE, Piscataway, NJ, USA, Dec. 15, 2007 (Dec. 15, 2007), pp. 1100-1104, XP031234290.

(Continued)

*Primary Examiner* — Patrick O Neill
(74) *Attorney, Agent, or Firm* — Locke Lord LLP; Daniel J. Fiorello; Gabrielle Gelozin

(57) ABSTRACT

A windowed watchdog circuit system can include a slow timer module configured to receive watchdog strobe signals from a processor and to determine whether a gap time between watchdog strobe signals is longer than a slow threshold time to output a slow threshold state when the gap time is longer than the slow threshold. The windowed watchdog circuit system can include a fast timer system configured to receive the watchdog strobe signals from the processor and to determine whether the gap time between watchdog strobe signals is shorter than a fast threshold time to output a fast threshold state when the gap time is shorted than the fast threshold. The windowed watchdog circuit system can be configured to output a reset state to reset the processor when any of the slow timer module and the fast timer system are outputting the slow threshold state or the fast threshold state, respectively.

20 Claims, 2 Drawing Sheets

(51) Int. Cl.
    *H03K 5/00*         (2006.01)
    *H03K 5/19*         (2006.01)

(56) References Cited

U.S. PATENT DOCUMENTS

| | | | |
|---|---|---|---|
| 9,740,236 B2 * | 8/2017 | Hegde | G06F 1/12 |
| 10,089,164 B2 | 10/2018 | Curtis | |
| 10,452,095 B2 | 10/2019 | Hegde | |
| 10,928,446 B2 * | 2/2021 | Krishna | G06F 11/2215 |
| 2020/0183770 A1 * | 6/2020 | Kokusho | G06F 11/0757 |

OTHER PUBLICATIONS

Jin Wook Lee et al:"The performance of a watchdog protocol for wireless network security", International Journal of Wireless and Mobile Computing, May 28, 2007 (May 28, 2007), pp. 28-36, XP055471035, DOI: 10.1504/IJWMC.2007.013793 Retrieved from the Internet: URL:https://www.beningo.com/wp-content/upl oads/images/Papers/WatchdogArchitectureRev iew.pdf.

Unni Ravi Krishnan et al:"FPGA Implementation of an Improved Watchdog Timer for Safety-Critical Applications", 2018 31ST International Conference on VLSI Design and 2018 17th International Conference on Embedded Systems (VLSID), IEEE, Jan. 6, 2018??(Jan. 6, 2018), pp. 55-60, XP033342145, DOI: 10.1109/VLSID.2018.37.

Partial European search report issued in corresponding EP application No. 21162754.2, dated Aug. 23, 2021.

\* cited by examiner

WATCHDOG CIRCUIT SYSTEMS

CROSS-REFERENCE TO RELATED APPLICATIONS

This application claims priority to and the benefit of Indian Application No. 202041011498, filed Mar. 17, 2020, the entire contents of which are herein incorporated by reference in their entirety.

FIELD

This disclosure relates to windowed watchdog circuit systems, for example.

BACKGROUND

Traditional watchdog circuits are based on a timer counter that counts down from some initial set timer value. If the counter expires, that resets the processor and reboots the embedded system. Therefore, the embedded software needs to restart the watchdog timer counter periodically by periodic trigger of the timer counter before the counter expires.

A watchdog circuit in an embedded system can be used to ensure that software is executing as expected. The theory is that if embedded software can periodically strobe/kick the watchdog circuit, then the other functions it is responsible for are also happening. If not properly strobing/kicking, then the watchdog circuit can cause a fall back to default safe state by resetting the system. Hence the embedded system with a watchdog circuit becomes self-reliant to handle software accidental infinite loops, stack corruptions, RAM bit twiddles and software malfunction issues, for example.

There exist two types of Watchdog circuit: single-sided watchdog circuit and windowed watchdog circuit. The single-sided watchdog circuit in general only detects a missing and a slow rate watchdog strobe from an interfaced embedded processor. The windowed watchdog circuit detects a fast rate watchdog strobe in addition to a slow rate and a missing watchdog strobe. Hence a windowed watchdog is a better solution than a single-sided watchdog.

In safety critical application such as aerospace application for higher reliability and mitigation over Single Event Effect generally the watchdog circuit will be implemented using an external piece of hardware rather than using a processor internal watchdog module which is software configurable.

Such conventional methods and systems have generally been considered satisfactory for their intended purpose. However, there is still a need in the art for improved watchdog circuit systems. The present disclosure provides a solution for this need.

SUMMARY

A windowed watchdog circuit system can include a slow timer module configured to receive watchdog strobe signals from a processor and to determine whether a gap time between watchdog strobe signals is longer than a slow threshold time to output a slow threshold state when the gap time is longer than the slow threshold. The watchdog circuit system can include a fast timer system configured to receive the watchdog strobe signals from the processor and to determine whether the gap time between watchdog strobe signals is shorter than a fast threshold time to output a fast threshold state when the gap time is shorter than the fast threshold. The watchdog circuit system can be configured to output a reset state to reset the processor when any of the slow timer module and the fast timer system are outputting the slow threshold state or the fast threshold state, respectively.

The fast timer system can include a fast timer module configured to output a first module state, and to output a second module state for the fast threshold time after receiving a watchdog strobe signal from the processor. The slow timer module and the fast timer module can include any suitable hardware and/or software module(s) configured to perform any suitable disclosed function, e.g., as disclosed herein, for example.

The fast timer system can include a latch having a state input, a clock input, and a latch output, wherein the state input of the latch is operatively connected to the fast timer module to receive the second module state. The latch can include any suitable hardware and/or software module(s) configured to perform any suitable disclosed function, e.g., as disclosed herein, for example.

The clock input can be configured to be connected to the processor to receive the watchdog strobe signals. The latch can be configured to switch from a first output state indicating the gap time is equal to or longer than the fast time threshold to a second output state indicating the gap time is shorter than the fast time threshold when the state input is receiving the second module state and the clock input receives a watchdog strobe signal.

The fast timer system can include a delay module configured to add a predetermined time delay to the first module state and/or the second module state from the fast timer module such that the state input of the latch receives the first module state and/or the second module state from the fast timer module delayed from the watchdog strobe signal received by the clock input. The delay module can include any suitable hardware and/or software module(s) configured to perform any suitable disclosed function, e.g., as disclosed herein, for example.

In certain embodiments, the latch can be a D-type latch. In certain embodiments, the watchdog circuit system can include a logic block connected to the latch output and the slow timer module and configured to output a normal state when both the slow timer module and the fast timer system are not outputting the slow threshold state and the fast threshold state, respectively. The logic block can also be configured to output a reset state when either the slow threshold state or the fast threshold state is received by the logic block. The logic block can be an AND block, for example.

In certain embodiments, the watchdog circuit system can include an OR block configured to output the reset state if the AND block outputs the reset state and if a watchdog mask does not output a mask state. In certain embodiments, the watchdog circuit system can include the processor (e.g., operatively connected to the slow timer module and the fast timer system).

In accordance with at least one aspect of this disclosure, a vehicle electronics device can include a watchdog circuit system as disclosed herein, e.g., as described above. Any other suitable application for the watchdog circuit system is contemplated herein.

In accordance with at least one aspect of this disclosure, a fast timer system for a circuit can include a fast timer module configured to output a first module state and to output a second module state for a fast threshold time after receiving a watchdog strobe signal from the processor. The fast timer system can include a latch having a state input, a clock input, and a latch output. The state input of the latch can be operatively connected to the fast timer module to receive the second module state. The clock input can be configured to be connected to the processor to receive the watchdog strobe signals. The latch can be configured to switch from a first output state indicating that watchdog strobe signal gap time is equal to or longer than the fast time threshold to a second output state indicating the gap time is shorter than the fast time threshold when the state input is receiving the second module state and the clock input receives a watchdog strobe signal. The fast timer system can include a delay module configured to add a predetermined time delay to the first module state and/or the second module state from the fast timer module such that the state input of the latch receives the first module state and/or the second module state from the fast timer module delayed from the watchdog strobe signal received by the clock input. Embodiments of a fast timer system can be implemented for any suitable application (e.g., a watchdog circuit, a windowed timing comparator, a wider band windowed frequency comparator for low frequency applications, etc.).

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
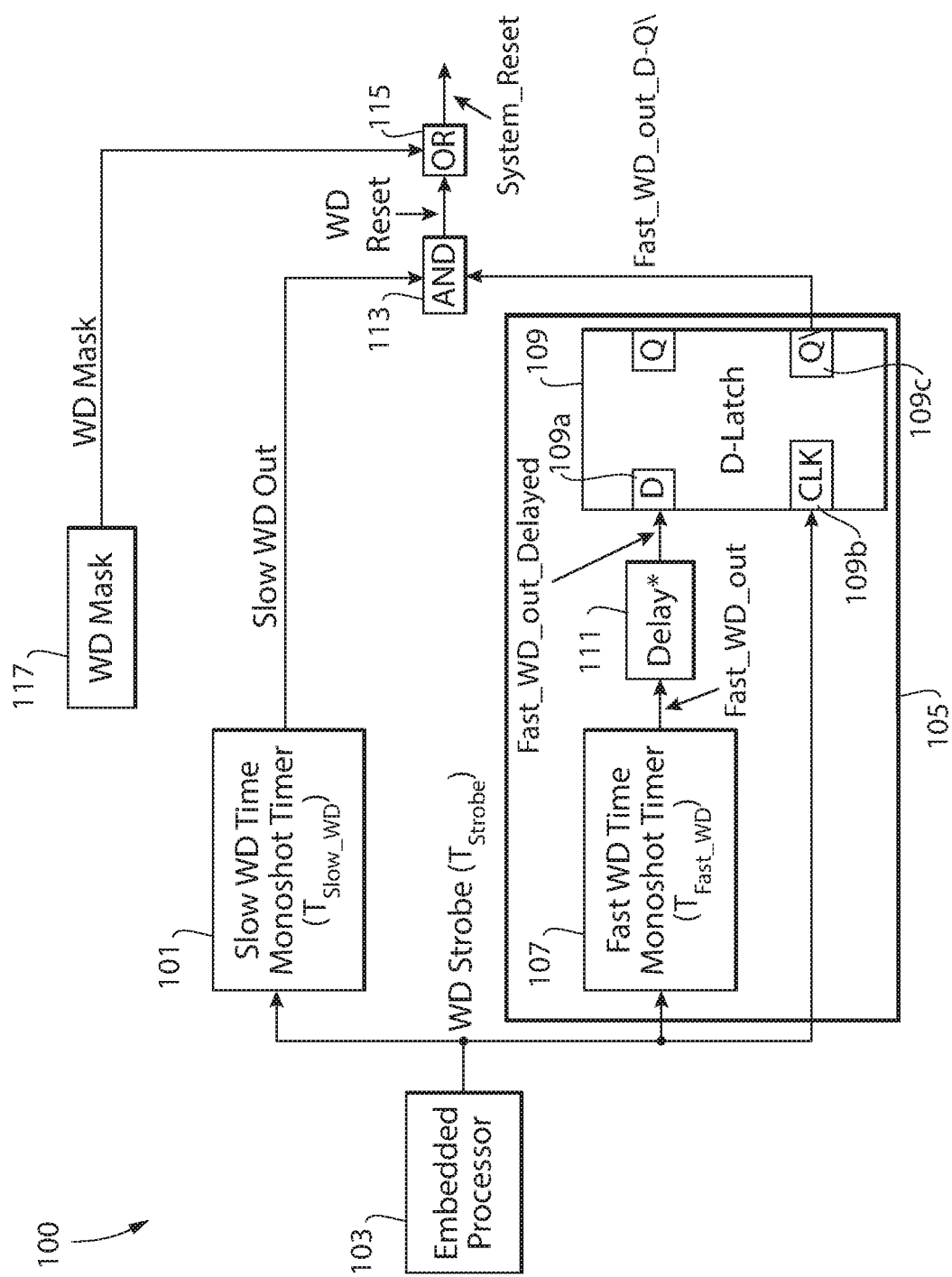
FIG. 1 is a schematic of an embodiment of a watchdog circuit system in accordance with this disclosure.

Reference will now be made to the drawings wherein like reference numerals identify similar structural features or aspects of the subject disclosure. For purposes of explanation and illustration, and not limitation, an illustrative view of an embodiment of a watchdog circuit system in accordance with the disclosure is shown in FIG. 1 and is designated generally by reference character 100. Other embodiments and/or aspects of this disclosure are shown in FIG. 2.

Figure 2:
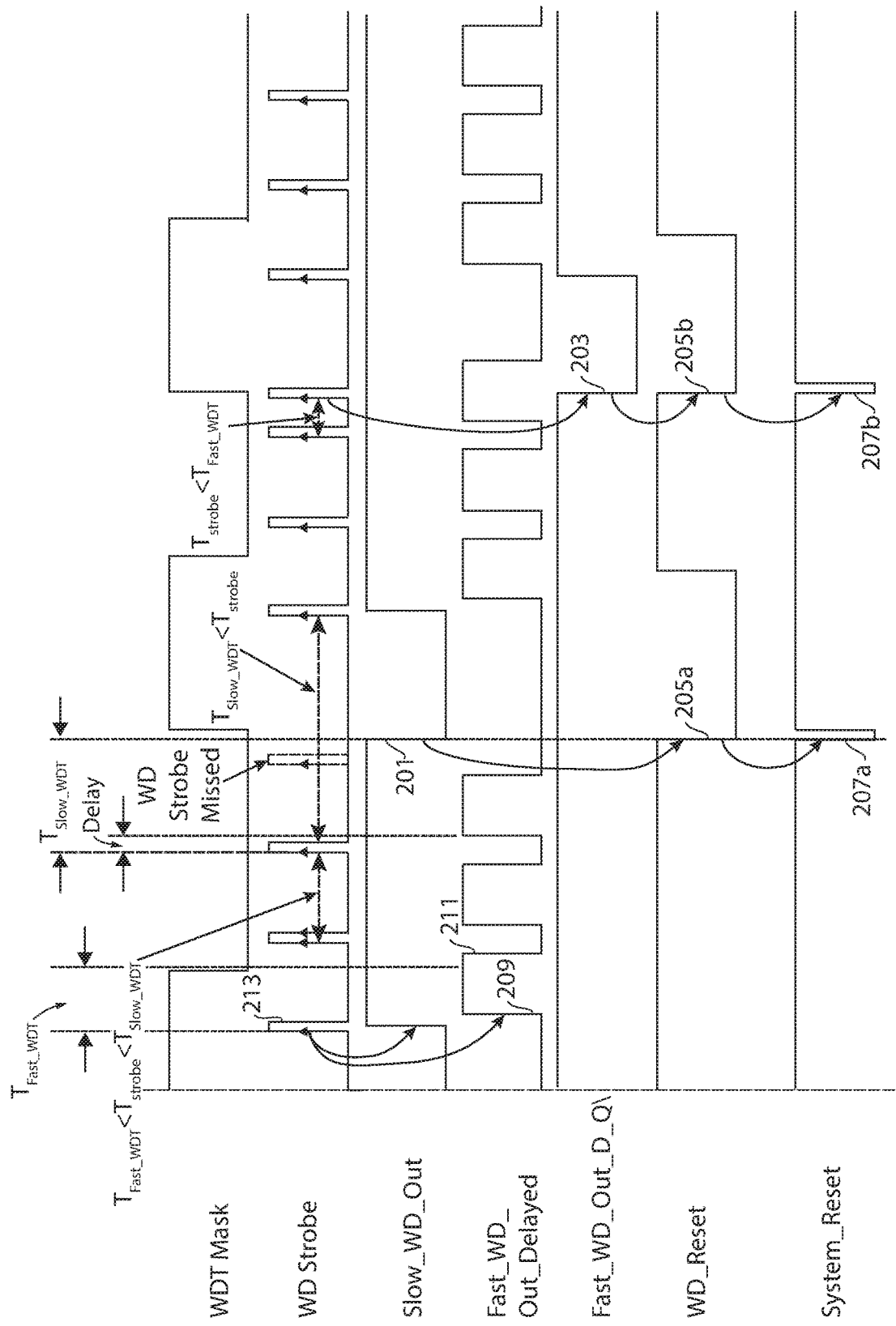
FIG. 2 is a state chart illustrating an embodiment of this disclosure in operation, showing a system reset due to a slow timer threshold and a system reset due to a fast timer threshold, and output states of certain components of the embodiment.

Referring to FIGS. 1 and 2, a windowed watchdog circuit system 100 can include a slow timer module 101 configured to receive watchdog strobe signals (e.g., shown as WD strobe in FIG. 2) from a processor 103 (e.g., an embedded processor). The slow timer module 101 can be configured to determine whether a gap time (shown as $T_{strobe}$, e.g., the time between rising edges of watchdog strobe signals) between watchdog strobe signals is longer than a slow threshold time (e.g., shown as $T_{Slow\_WDT}$) to output a slow threshold state (e.g., to change from an output of 1 to an output of 0 at falling edge 201 of Slow_WD_Out) when the gap time is longer than the slow threshold (e.g., shown as $T_{Slow\_WDT} < T_{Strobe}$).

The watchdog strobe signals can be short outputs from the processor 103 (e.g., changing from output of 0 to 1 and back to 0 in a relatively short period of time as shown in FIG. 2). Any other suitable watchdog strobe signal is contemplated herein.

The watchdog circuit system 100 can include a fast timer system 105 configured to receive the watchdog strobe signals from the processor 103 and to determine whether the gap time between watchdog strobe signals is shorter than a fast threshold time (e.g., shown as $T_{Fast\_WDT}$) to output a fast threshold state (e.g., to change from an output of 1 to an output of 0, e.g., as shown at falling edge 203 of Fast_WD_Out_D_Q\) when the gap time is shorter than the fast threshold (e.g., shown as $T_{Strobe} < T_{Fast\_WDT}$). The watchdog circuit system 100 can be configured to output a reset state (e.g., any suitable signal, e.g., shown as WD_Reset and/or System_Reset) to reset the processor 103 when any of the slow timer module 101 and the fast timer system 105 are outputting the slow threshold state or the fast threshold state, respectively. For example, as shown, the system 100 can be configured to change an output state from 1 to 0 (e.g., at falling edges 205a, 205b and/or falling edges 207a, 207b as shown).

In certain embodiments, a first portion of the system 100 can output a first reset state (e.g., WD_Reset) and a second portion of the system 100 can output a second reset state (e.g., System_Reset). The first and second reset states can be the same or different (e.g., different as shown; System_Reset is shown shorter than WD_Reset, e.g., as a function of a mask). While multiple reset outputs are shown, it is contemplated herein that a single reset state or any other suitable reset state can be utilized.

The fast timer system 105 can include a fast timer module 107 configured to output a first module state (e.g., low, e.g., an output of 0, e.g., as shown indirectly in Fast_WD_Out_Delayed) and to output a second module state (e.g., high, e.g., an output of 1; shown with delay in FIG. 2) for the fast threshold time (e.g., from rising edge 209 to falling edge 211) after receiving a watchdog strobe signal (e.g., after rising edge 213) from the processor 103. The slow timer module 101 and the fast timer module 107 can include any suitable hardware and/or software module(s) configured to perform any suitable disclosed function, e.g., as disclosed herein, for example.

The fast timer system 105 can include a latch 109 having a state input 109a, a clock input 109b, and a latch output 109c. The state input 109a of the latch 109 can be operatively connected to the fast timer module 107 to receive the first module state and the second module state. The latch 109 can include any suitable hardware and/or software module(s) configured to perform any suitable disclosed function, e.g., as disclosed herein, for example.

The clock input 109b can be configured to be connected to the processor 103 to receive the watchdog strobe signals (e.g., as shown in FIG. 1). The latch 109 can be configured to switch from a first output state (e.g., an output of 1) indicating the gap time is equal to or longer than the fast time threshold to a second output state indicating the gap time is shorter than the fast time threshold when the state input 109a is receiving the second module state (e.g., an output of 1 from the fast timer module 107) and the clock input 109b receives a watchdog strobe signal (e.g., shown at the time of falling edge 203 in FIG. 2). The output of an embodiment of the latch 109 is shown in FIG. 2 as Fast_WD_Out_D_Q\, for example.

The fast timer system 105 can include a delay module 111 configured to add a predetermined time delay (e.g., Delay as shown in FIG. 2) to the first module state and/or the second module state from the fast timer module 107 such that the state input 109a of the latch 109 receives the first module state and/or the second module state (e.g., an output of 1) from the fast timer module 107 delayed from the watchdog strobe signal received by the clock input 109b. For example, as can be seen in FIG. 2, there is a time delay between each rising edge (e.g., 213) of each strobe and each rising edge (e.g., 209) of each output from the fast timer module 107. The delay module 111 can include any suitable hardware and/or software module(s) configured to perform any suitable disclosed function, e.g., as disclosed herein, for example. The output from an embodiment of the delay module 111 is shown in FIG. 2 as Fast_WD_Out_Delayed, for example.

In certain embodiments, the latch 109 can be a D-type latch, e.g., as shown. In certain embodiments, the watchdog circuit system 100 can include a logic block 113 connected to the latch output 109c and the slow timer module 101 and configured to output a normal state (e.g., an output of 1) when both the slow timer module 101 and the fast timer system 105 are not outputting the slow threshold state and the fast threshold state, respectively. The logic block 113 can also be configured to output a reset state (e.g., shown as WD_Reset) when either the slow threshold state or the fast threshold state is received by the logic block 113 (e.g., as shown at 205a and 205b). The logic block 113 can be an AND block, for example. Any other suitable logic block with any suitable hardware and/or software module(s) is contemplated herein.

In certain embodiments, the watchdog circuit system 100 can include an OR block 115 configured to output the reset state (e.g., shown as System_Reset) if the AND block outputs the reset state and a watchdog mask 117 does not output a mask state. In certain embodiments, the watchdog circuit system 100 can include the processor 103 (e.g., operatively connected to the slow timer module 101 and the fast timer system 105).

As used herein, a state output and be any suitable output type (e.g., digital, analog) and/or can include a signal or an absence thereof. For example, the state output can be a binary 1 or a 0, e.g., as described above, or any other suitable discrete or variable output.

In accordance with at least one aspect of this disclosure, a vehicle electronics device (e.g., for an aircraft) can include a watchdog circuit system as disclosed herein, e.g., 100 as described above. Any other suitable application for the watchdog circuit system is contemplated herein.

In accordance with at least one aspect of this disclosure, a fast timer system for a circuit can include any suitable fast timer system (e.g., 105) disclosed herein, e.g., as described above. For example, the fast timer system can include a fast timer module configured to output a first module state and to output a second module state for a fast threshold time after receiving a watchdog strobe signal from the processor. The fast timer system can include a latch having a state input, a clock input, and a latch output. The state input of the latch can be operatively connected to the fast timer module to receive the second module state (e.g., and the first module state). The clock input can be configured to be connected to the processor to receive the watchdog strobe signals. The latch can be configured to switch from a first output state indicating that watchdog strobe signal gap time is equal to or longer than the fast time threshold to a second output state indicating the gap time is shorter than the fast time threshold when the state input is receiving the second module state and the clock input receives a watchdog strobe signal. The fast timer system can include a delay module configured to add a predetermined time delay to the first module state and/or the second module state from the fast timer module such that the state input of the latch receives the first module state and/or the second module state from the fast timer module delayed from the watchdog strobe signal received by the clock input. Embodiments of a fast timer system can be implemented for any suitable application (e.g., a windowed watchdog circuit, a windowed timing comparator, a wider band windowed frequency comparator for low frequency applications, etc.).

Embodiments of a windowed watchdog (WWD) circuit topology can include two monoshot timers (e.g., slow timer module 101 and fast timer module 107), e.g., shown as a Slow WD time monoshot timer and Fast WD time monoshot timer, which can trigger an output as a function of the watchdog strobe (e.g., WD_Strobe) from processor within certain time constraints. These timers can be made using off the shelf timer integrated circuits (ICs) and discrete passive devices (e.g., a 555 timer IC, resistors and capacitors).

The Slow WD time Monoshot timer setting $T_{Slow\_WD}$ can be greater than $T_{strobe}$. The slow timer module can be configured to not trigger its output in good or normal operating condition and faster strobe faulty condition, i.e. where $T_{strobe} < T_{Slow\_WD}$. But for slower rate or missing of watchdog strobe faulty condition, i.e. $T_{Slow\_WD} < T_{Strobe}$ the timer expires and trigger its output and thereby ultimately drives System Reset.

The Fast WD time Monoshot timer setting $T_{Fast\_WD}$ can be less than $T_{strobe}$. For example, in normal operating condition and slower rate or missing of watchdog strobe faulty condition, the timer can expire and trigger its output (pull low as shown in FIG. 2). However, for the fast rate watchdog strobe faulty condition, i.e., $T_{Strobe} < T_{Fast\_WD}$ the timer can be retriggered before it expires and hence does not trigger the output.

Certain embodiments can latch the fast rate watchdog strobe condition and thereby drive WD_Reset and System_Reset even though the Fast WD time Monoshot timer is not tripped and not triggered its output. Such embodiments can also de-assert WD_Reset and System_Reset and de-latch the fast rate watchdog strobe fault condition once the watchdog strobe is transitioned from fast rate fault condition to normal operating or slower rate fault condition. Embodiments can inhibit driving of WD_Reset and System_Reset even though Fast WD time Monoshot timer triggers its output during watchdog strobe normal operating or slower rate fault condition. All the above can be achieved by deriving WD_Reset or System_Reset using a watchdog strobe triggered, latched negative D-Latch output (Q\) of Fast WD time Monoshot timer output. Certain D-Latch devices have a wide operating temperature range, for example.

Embodiments can include a slow timer module such that if the strobe is slow, or not there at all, this will output (e.g., drive low). Embodiments can include a fast timer system checking to see if strobes come within a fast time frame, and if not, outputting a normal state (e.g., drive high). Embodiments can include a delay module that introduces a propagation delay to ensure that the data from the fast timer is delayed (e.g., 1 microsecond delay) to a latch relative to the watchdog strobe. Embodiments can include a D-type latch where the latch negative output outputs an inverted signal, and the latch can switch state when fast timer is outputting (e.g., an output of 1) and another strobe is received. A mask can be implemented to prevent the watchdog system from causing reset right after start up or reset until embedded processor boot-up or ready.

Embodiments of a windowed watchdog circuit topology can be realized using widely available and wide operating temperature complaint digital devices and logic gates. Hence embodiments gains advantages of low cost, obsolescence prevention, and wide operating range compliance. Embodiments can be used in any suitable application (e.g., windowed timing comparator, wider band windowed frequency comparator for low frequency application).

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A windowed watchdog circuit system, comprising:
a slow timer module configured to receive watchdog strobe signals from a processor and to determine whether a gap time between watchdog strobe signals is longer than a slow threshold time to output a slow threshold state when the gap time is longer than the slow threshold time;
a fast timer system configured to receive the watchdog strobe signals from the processor and to determine whether the gap time between watchdog strobe signals is shorter than a fast threshold time to output a fast threshold state when the gap time is shorter than the fast threshold time,
wherein the windowed watchdog circuit system is configured to output a reset state to reset the processor when any of the slow timer module and the fast timer system are outputting the slow threshold state or the fast threshold state, respectively.

2. The system of claim 1, wherein the fast timer system includes a fast timer module configured to output a first module state, and to output a second module state for the fast threshold time after receiving a watchdog strobe signal from the processor.

3. The system of claim 2, wherein the fast timer system includes a latch having a state input, a clock input, and a latch output, wherein the state input of the latch is operatively connected to the fast timer module to receive the second module state.

4. The system of claim 3, wherein the clock input is configured to be connected to the processor to receive the watchdog strobe signals.

5. The system of claim 4, wherein the latch is configured to switch from a first output state indicating the gap time is equal to or longer than the fast time threshold to a second output state indicating the gap time is shorter than the fast time threshold when the state input is receiving the second module state and the clock input receives a watchdog strobe signal.

6. The system of claim 5, wherein the fast timer system includes a delay module configured to add a predetermined time delay to the first module state and/or the second module state from the fast timer module such that the state input of the latch receives the first module state and/or the second module state from the fast timer module delayed from the watchdog strobe signal received by the clock input.

7. The system of claim 6, wherein the latch is a D-type latch.

8. The system of claim 6, further comprising a logic block connected to the latch output and the slow timer module and configured to output a normal state when both the slow timer module and the fast timer system are not outputting the slow threshold state and the fast threshold state, respectively, and wherein the logic block is configured to output a reset state when either the slow threshold state or the fast threshold state is received by the logic block.

9. The system of claim 8, wherein the logic block is an AND block.

10. The system of claim 9, further comprising an OR block configured to output the reset state if the AND block outputs the reset state and if a watchdog mask does not output a mask state.

11. The system of claim 1, further comprising the processor.

12. A vehicle electronics device, comprising:
a windowed watchdog circuit system, comprising:
a slow timer module configured to receive watchdog strobe signals from a processor and to determine whether a gap time between watchdog strobe signals is longer than a slow threshold time to output a slow threshold state when the gap time is longer than the slow threshold time;
a fast timer system configured to receive the watchdog strobe signals from the processor and to determine whether the gap time between watchdog strobe signals is shorter than a fast threshold time to output a fast threshold state when the gap time is shorter than the fast threshold time,
wherein the windowed watchdog circuit system is configured to output a reset state to reset the processor when any of the slow timer module and the fast timer system are outputting the slow threshold state or the fast threshold state, respectively.

13. The device of claim 12, wherein the fast timer system includes a fast timer module configured to output a first module state and to output a second module state for the fast threshold time after receiving a watchdog strobe signal from the processor.

14. The device of claim 13, wherein the fast timer system includes a latch having a state input, a clock input, and a latch output, wherein the state input of the latch is operatively connected to the fast timer module to receive the second module state.

15. The device of claim 14, wherein the clock input is configured to be connected to the processor to receive the watchdog strobe signals.

16. The device of claim 15, wherein the latch is configured to switch from a first output state indicating the gap time is equal to or longer than the fast time threshold to a second output state indicating the gap time is shorter than the fast time threshold when the state input is receiving the second module state and the clock input receives a watchdog strobe signal.

17. The device of claim 16, wherein the fast timer system includes a delay module configured to add a predetermined time delay to the first module state and/or the second module state from the fast timer module such that the state input of the latch receives the first module state and/or the second module state from the fast timer module delayed from the watchdog strobe signal received by the clock input.

18. The device of claim 17, wherein the latch is a D-type latch.

19. The device of claim 18, further comprising a logic block connected to the latch output and the slow timer module and configured to output a normal state when both the slow timer module and the fast timer system are not outputting the slow threshold state and the fast threshold state, respectively, and wherein the logic block is configured to output a reset state when either the slow threshold state or the fast threshold state is received by the logic block.

20. A fast timer system for a circuit, comprising:
a fast timer module configured to output a first module state and to output a second module state for a fast threshold time after receiving a watchdog strobe signal from the processor;
a latch having a state input, a clock input, and a latch output, wherein the state input of the latch is operatively connected to the fast timer module to receive the second module state, wherein the clock input is configured to be connected to the processor to receive the watchdog strobe signals, wherein the latch is configured to switch from a first output state indicating that watchdog strobe signal gap time is equal to or longer than the fast time threshold to a second output state indicating the gap time is shorter than the fast time threshold when the state input is receiving the second module state and the clock input receives a watchdog strobe signal; and
a delay module configured to add a predetermined time delay to the first module state and/or the second module state from the fast timer module such that the state input of the latch receives the first and/or second module state from the fast timer module delayed from the watchdog strobe signal received by the clock input.

* * * * *